US006678875B2

(12) United States Patent
Pajak et al.

(10) Patent No.: US 6,678,875 B2
(45) Date of Patent: Jan. 13, 2004

(54) SELF-CONTAINED EMBEDDED TEST DESIGN ENVIRONMENT AND ENVIRONMENT SETUP UTILITY

(75) Inventors: Brian John Pajak, Millbury, MA (US); Paul Price, Stoughton, MA (US); Jean-François Côté, Chelsea (CA); Luc Romain, Aylmer (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 10/323,979

(22) Filed: Dec. 20, 2002

(65) Prior Publication Data

US 2003/0145286 A1 Jul. 31, 2003

Related U.S. Application Data

(60) Provisional application No. 60/350,979, filed on Jan. 25, 2002, provisional application No. 60/354,015, filed on Feb. 5, 2002, and provisional application No. 60/354,016, filed on Feb. 5, 2002.

(51) Int. Cl.[7] .............................................. G06F 17/50
(52) U.S. Cl. .................. 716/11; 716/2; 716/3; 716/5; 716/8; 716/17
(58) Field of Search .............................. 716/11, 2, 3, 5, 716/8, 17; 707/103

(56) References Cited

U.S. PATENT DOCUMENTS

| 5,452,468 A | * | 9/1995 | Peterson ..................... 345/419 |
| 5,519,628 A | * | 5/1996 | Russell et al. ................ 716/10 |
| 5,574,898 A |   | 11/1996 | Leblang et al. |
| 5,778,368 A | * | 7/1998 | Hogan et al. ................. 707/10 |
| 5,826,265 A | * | 10/1998 | Van Huben et al. ............ 707/8 |
| 5,903,475 A | * | 5/1999 | Gupte et al. .................... 703/16 |
| 5,907,494 A | * | 5/1999 | Dangelo et al. ................ 703/1 |
| 5,978,811 A |   | 11/1999 | Smiley |
| 5,978,940 A |   | 11/1999 | Neuman et al. |
| 6,094,684 A | * | 7/2000 | Pallmann ..................... 709/227 |
| 6,120,550 A |   | 9/2000 | Southgate et al. |
| 6,178,546 B1 |  | 1/2001 | McIntyre |
| 6,370,675 B1 |  | 4/2002 | Matsumura et al. |
| 6,453,276 B1 |  | 9/2002 | Bauman |
| 6,571,282 B1 | * | 5/2003 | Bowman-Amuah ......... 709/219 |
| 2002/0116153 A1 | | 8/2002 | Wybouv-Cognard |
| 2003/0005396 A1 | * | 1/2003 | Chen et al. ..................... 716/5 |
| 2003/0033379 A1 | * | 2/2003 | Civanlar et al. ............ 709/218 |
| 2003/0135842 A1 | * | 7/2003 | Frey et al. .................. 717/121 |

OTHER PUBLICATIONS

Yen et al., "An on–line repositor for embedded software" Tools with Artificial Intelligence, Proceedings of the 13th International Conference on , Nov. 7–9, 2001 pp.: 314–321.*
Schindler et al., "IP repository, a Web based IP reuse infrastructure" Custom Integrated Circuits, 1999. Proceedings of the IEEE 1999 , May 16–19, 1999 pp.: 415–418.*

* cited by examiner

Primary Examiner—Matthew Smith
Assistant Examiner—Andrea Liu
(74) Attorney, Agent, or Firm—Eugene E. Proulx

(57) ABSTRACT

An embedded test, chip design utility is an ease-of-use utility for assisting a circuit designer in quickly implementing a circuit embedded test design flow. Using the utility, a designer transforms a design netlist to include embedded test structures. The utility automatically builds a workspace containing a predetermined repository structure and design environment, generates control files for executing design automation tools that operate within the design flow, and encapsulates the data so as to be self-contained and easily transferable to other design teams.

41 Claims, 10 Drawing Sheets

Fig. 9.

```
1   */
2   Configuration (MyTopLevel) {
3   // --
4   // -- To obtain a template file with detailed comments, use -genTemplate On in
5   // -- conjunction with -TemplateDetails High.
6   // --
7
8       //                    -------------- GLOBAL OPTIONS --------------------
9
10      DirectoryName              : MyTopLevel_LVWS;        //dirName;
11      Language                   : Verilog;  // (Verilog) | VHDL
12
13      Simulator ( <Simulator> ) { // Verilog-XL | Verilog-NC | Modeltech | NCVHDL | Leapfrog |
14          VCS
15
16      // Default values per Simulator
17      // ------------------------------------
18          Command : <SimulatorCommand> ;           // Verilog-XL=verilog,
19                                                   // Verilog-NC=ncxlmode
20                                                   // ModelTech=vlog,  VCS=vcs
21      // CompileCommand       :   <SimulatorCompileCommand>;   // ModelTech=vcom,
22                                                               Leapfrog=cv, NCVHDL=ncvhdl
23      // SimulateCommand      :   <SimulatorSimulateCommand>;  // ModelTech=vsim,
24                                                               Leapfrog=sv, NCVHDL=ncsim
25      // ElaborateCommand     :   <SimulatorElaborateCommand>; // Leapfrog=ev,
26                                                               NCVHDL=ncelab
27      }
28      RTLExtension               : vb; // Specify the string after the '.'
29      GateExtension              : v; // Specify the string after the '.'
30      PatternType                : WGL; // None, (WGL), FTDL, TSTL;
31      Backup                     : Off; //(On) | Off;
32
33      //                    ---------------- FLOW SPECIFICATION ----------------
34
35      Target(Top)                : MyTopLevel;
36      DesignaMergeFlow           : RTL; //(RTL) | Gate;
```

Fig. 10.

```
1    //------------------- ENVIRONMENT SPECIFICATION ---------------
2      VendorLib(<VendorLibID>) { // ex: tgc1000
3         VerilogOptionFile           : <HierarchicalFileName | FileName>;
4         DefineFile                  : <HierarchicalFileName | FileName>;
5         SimModelDir  (<SimLibID>)   : <HierarchicalDirPath>;
6         SimModelFile (<SimLibID>)   : <HierarchicalFilePath>;
7         MemModelDir  (<MemLibID>)   : <HierarchicalDirPath>;
8         MemModelFile (<MemLibID>)   : <HierarchicalFilePath>;
9         ScanModelDir (<ScanLibID>)  : <HierarchicalDirPath>;
10        ScanModelFile(<ScanLibID>)  : <HierarchicalFilePath>;
11        ScangLib                    : <HierarchicalFileName>;
12        PadLib                      : <HierarchicalFileName>;
13        SynModelDir  (<SynLibID>)   : <HierarchicalFilePath>;
14        DcSetupFile                 : <HierarchicalFileName>;
15        VssLib                      : <HierarchicalDirPath>;
16        CellExtension               : <string>;
17        customBlibFile              : <HierarchicalFileName>;
18     }
19     ModulesLV {
20        SimModelDir  (<LibID>)      : <HierarchicalDirPath>;
21        SimModelFile (<LibID>)      : <HierarchicalFilePath>;
22     }
23     ModulesScan {
24        ScanModelDir (<LibID>)      : <HierarchicalDirPath>;
25        ScanModelFile (<LibID>)     : <HierarchicalFilePath>;
26     }
27     ModulesRTL {                   //Optional when DesignaMergeFlow is Gate
28        SimModelDir  (<LibID>)      : <HierarchicalDirPath>;
29        IncDir       (<LibID>)      : <HierarchicalDirPath>;
30     }
31     ModulesGate {
32        SimModelDir  (<LibID>)      : <HierarchicalDirPath>;
33     }
34     EmbeddedLVDB ( <LVDBDirectoryPath> ) {
35        Type                        : EmbeddedLogicTestCore; // Block | LegacyCore
36        ParentBlock                 : <TopLevelLogicBlockName>;
37        TopModuleName               : <Module Name>;
38        SimTargetLabel              : <string>;
39        ConcatenatedNetlist         : <HierarchicalFilePath | FileName>;
40
41        SubObject ( <ModuleName> ) {
42           Type                     : EmbeddedLogicTestCore; // Block | LegacyCore
43           ConcatenatedNetlist      : <HierarchicalFilePath | FileName>;
44           SimTargetLabel           : <string>;
45
46        SubObject ( <ModuleName> ) {
47           Type                     : EmbeddedLogicTestCore; // Block | LegacyCore
48           ConcatenatedNetlist      : <HierarchicalFilePath | FileName>;
49           SimTargetLabel           : <string>;
50          }
51        }
52     }
```

Fig. 11.

```
1    //              -------------------- EMBEDDED TEST SPECIFICATION ---------------
2
3       MemBist(<DesignName>:  [Controller 44]) {
4          ConfigFile                    : <HierarchicalFilePath | FileName>;
5          MemLibFile                    : <HierarchicalFilePath | FileName>;
6          RomContentFile                : <HierarchicalFilePath | FileName>;
7          ClockPeriod                   : 100; // 100ns
8          ParentBlock                   : <TopLevelLogicBlockName>: [Block 10];
9       }
10
11
12      PllBist(<DesignName>:  [Controller 46] {
13         ConfigFile                    : <HierarchicalFilePath | FileName>;
14         ClockPeriod                   : 20; // 20ns  Block 10
15         ParentBlock                   : <TopLevelLogicBlockName>: [Block 10];
16      }
17
18
19      Other Test Controllers {
20      .
21      .
22      .
23
24      }
25      .
26      .
27      .
28      .
29
30      PrepareLogicFlow (<LogicBlockModuleName>) {
31         UseTestPoints                 : Yes;   // (Yes) | No;
32         MaxTestPoints                 : 100;   // 1 testpoint per 1000 gates recommended.
33         FaultCoverage                 : 95.0;  // 0 - 100%
34         PatternSet                    : 64k;   // Pattern size for testpoint selection
35         ExternalCBD                   : Yes;   // (Yes) | No;
36      }
37
38      TopFlow {
39         BoundaryScanPresent           : Yes; //(Yes) | No
40         LogicTest {
41            BscanCaptureByDomain       : No; // Yes | (No)
42            NumberMultiChains          : <int>;
43            LogicBistPresent           : Yes; //(Yes) | No
44            ClockPeriod                : 20; // 20ns
45         }
46      }
47   }
```

SELF-CONTAINED EMBEDDED TEST DESIGN ENVIRONMENT AND ENVIRONMENT SETUP UTILITY

CROSS-REFERENCE TO RELATED APPLICATIONS

This application claims the benefit of U.S. Provisional Application Serial No. 60/350,979 filed Jan. 25, 2002.

This application is related to U.S. Provisional Application Serial No. 60/354,015 filed Feb. 5, 2002 for "Method and Program Product for Completing a Chip Design Having Embedded Test Structures", incorporated herein by reference.

This application is related to U.S. Provisional Application Serial No. No. 60/354,016 filed Feb. 5, 2002 for "Method and Program Product for Verification of a Circuit Design", incorporated herein by reference.

BACKGROUND OF THE INVENTION

1. Field of the Invention

The present invention relates, in general, to the design of integrated circuits and, more specifically, to a framework or workspace for use in the design, verification and integration of circuits and to an environment setup utility for automating the creation of the framework.

2. Description of Related Art

As integrated circuits continue to become increasingly more complex, it is becoming increasingly more important to embed into the circuits test structures which can be used during and after manufacture to test the circuit and its various sub-circuits and components. The generation and integration of these test structures is complex and tedious because a circuit may required many specialized test structures and include embedded circuit blocks which also require test structures. By way of example, FIG. 1 illustrates a relatively simple test ready circuit 10 having a variety of embedded test structures. The circuit includes an embedded circuit block 12 which has logic 14, a DRAM 16, and a legacy core 18. The test structures which are embedded in embedded block 12 include a logic BIST controller 20 associated with logic 14, a memory test controller 22 associated with DRAM 16 and a core socket 24 which provides isolation and access to legacy core 18. The top module 30 of circuit 10 includes logic 32, two memory units, including a SRAM 34 and ROM 36, a phase locked loop (PLL) 38, an analog-to-digital converter (ADC) 40 and a number of circuit input and output pins. The test structures which were added to the top module include a logic test controller 42 associated with logic 32, a memory test controller 44 associated with SRAM 34 and ROM 36, a phase locked loop test controller 46 associated with PLL 38, an ADC test controller 48 associated with ADC 40, interconnect test controllers 50, 52, and 54, and a test access port (TAP) 56 connected to the various test controllers. In addition, non-scannable memory elements in each of the embedded block and the top module were converted to scannable memory elements and arranged into scan chains. Test vectors and test patterns were generated and stored during the course of designing and integrating the test structures in the circuit block.

The embedded test structures are used cooperatively for testing sub-blocks, which may be buried deep within an embedded block, from the circuit pins such as the test access port.

Automation tools, available from the patentee, LogicVision, Inc. of San Jose, Calif., may be used to generate and verify the test structures and assemble them into a circuit description of a circuit under development. Generally, each test structure has a respective, specialized set of automation tools which provide several optional features, which or may not be included, depending on the desires of the designer. Thus, In addition to the complexity of the circuit itself and of the test structures which must be designed into the circuit, a designer faces the complexity of operating various automation tools which must be used to analyze the circuit, create the appropriate test structures, create test vectors and patterns to test the circuit, verify the test structures and perform all of the many and varied tasks which must be performed to provide a test ready circuit. The automation tools necessarily generate a relatively, large number of electronic files which must be stored, managed and accessed during the design-for-test process.

Applicant is not aware of any system or framework which has been proposed for organizing the many electronic files which are created by design-for-test procedures and operations, or of a utility for creating such a framework based on the specific needs and desires of a circuit designer. There is a need for both a design-for-test framework for use in storing embedded test structure related files and a environment setup utility for creating a design-for-test framework.

SUMMARY OF THE INVENTION

The present invention seeks to provide a self-contained design environment for storing files associated with the design of circuits and a setup utility for generating the design environment based on the specific needs of the circuit designer.

One aspect of the present invention is generally defined as a program product for use in creating a self-contained, design-for-test workspace on a computer readable storage medium for storing design-for test files associated with a circuit block, comprising means for generating a circuit block repository on the storage medium, the circuit block repository including a repository for each of predetermined design flows; process control file generating means for generating a process control file for selected repositories for use in performing predetermined operations; and means for creating links to repositories for circuit design files, library files and databases of blocks embedded in the circuit block.

Automated Benefits

Using the utility to implement embedded test provides a number of major benefits. First, based on the user's input to the utility, the utility sets up the user's design environment automatically and according to intended design flow. The utility creates a directory structure or workspace and populates the directories with pertinent design data, including readme files that the utility creates to provide clear instructions on what the user needs to do to complete each step of the design process, and process control files generated by the utility to provide all the command-line runtime options and appropriate settings required to implement the embedded test design flow and, more specifically, to run specialized automation tools. Second, the starter templates generated by the utility provide all the input files required to run the full embedded test design flow as well as individual design phases within this flow. The starter templates require minimal editing by the user, if any. If a user chooses to use the default values when running the process control files, the user need not make any edits to the files. Third, all data is transferable at all levels. The user can transfer the entire design or only a level within the design hierarchy that is problematic. Data is transferable because the utility creates a design environment and a set of process control files that are all relative-that is, information that is not hard-coded.

Another aspect of the present invention relates to the workspace or framework for use in the design of a circuit. This aspect is generally defined as a self-contained, circuit design framework for use in a computer readable storage medium for storing files associated with designing a circuit block according to a design flow having a plurality of phases and using design automation tools for generating the test files, the framework comprising a circuit block repository having design environment repositories containing links to design library repositories and files so that all scripts referring to the repositories and files use a relative path to the links contained within the design environment repositories; a design flow repository for each phase of the plurality of design flow phases; a process control file in the circuit block repository and each design flow repository for use in performing predetermined operations; a process information file corresponding to each process control file and describing the operations; and a design flow configuration file in each of the circuit block and design flow repository for use in specifying design flow options and parameter values.

BRIEF DESCRIPTION OF THE DRAWINGS

These and other features of the invention will become more apparent from the following description in which reference is made to the appended drawings in which:

FIG. 9 illustrates a Global Options section and a Flow Specification section of a representative workspace configuration file created by the environment setup utility in response to user input, according to an embodiment of the present invention;

FIG. 10 illustrates a Design Environment section of a representative workspace configuration file created by the environment setup utility in response to user input, according to an embodiment of the present invention;

FIG. 11 illustrates an Embedded Test Specification section of a representative workspace configuration file created by the environment setup utility in response to user input, according to an embodiment of the present invention.

DETAILED DESCRIPTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

The present invention is particularly concerned with the provision of a self-contained design-for-test design framework or environment for a circuit and with an environment setup utility for use in creating the design-for-test environment on a computer readable storage medium. The framework is primarily intended for use in storing files associated with generating, verifying and integrating various test structures into a circuit. The test structures are used during manufacturing and thereafter for verifying proper operation of the circuit and/or system in which the circuit is located. The framework and tool will be better appreciated from brief description a circuit design flow by which test structures are embedded into a circuit design according to the present invention.

The term "test structure" generally refers to circuitry which is inserted into a circuit for use in testing the circuit. As will be seen from the following description, the test structures may take various forms, including test controller circuitry of various types, test access ports, boundary scan cells, test collars, scannable memory elements, scan chains, and so forth. The details of these structures is not important in order to understand the present invention and, accordingly, the structures are not described in any detail.

Figure 2:
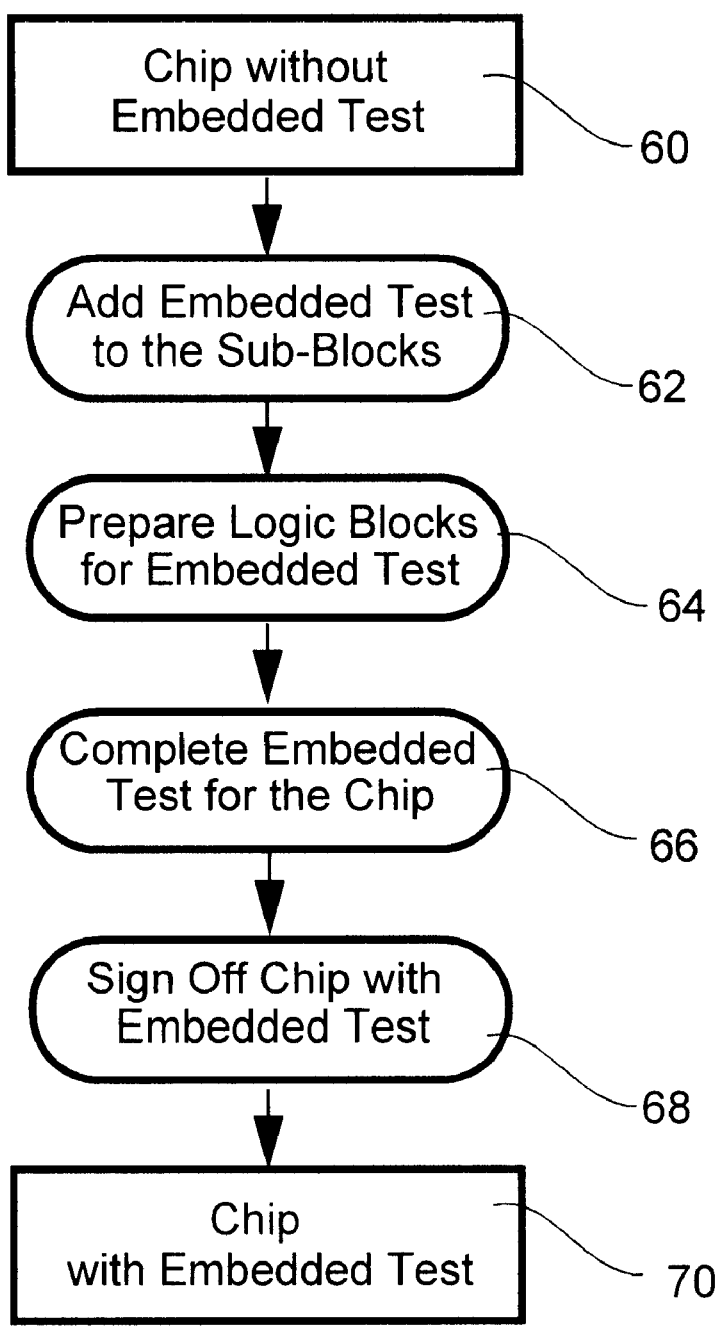
FIG. 2 is a block diagrammatic view of an embedded test design flow for use in generating and integrating circuit test structures into a circuit according to a preferred embodiment of the present invention.

FIG. 2 diagrammatically and generally illustrates a preferred embedded test design flow in which test structures are integrated into a circuit design 60. The embedded test design flow includes four basic phases including a sub-block flow 62, a prepare logic flow 64, a top-level flow 66 and a sign-off flow 68 which results in a test ready circuit design 70.

Sub-block flow 62 adds embedded test to sub-blocks of circuit blocks or cores. The flow generally involves generating or creating sub-block test structures, verifying the test structures, integrating the generated test structures into the top-level circuit blocks and then verifying the circuit block with its embedded test structures.

Figure 3:
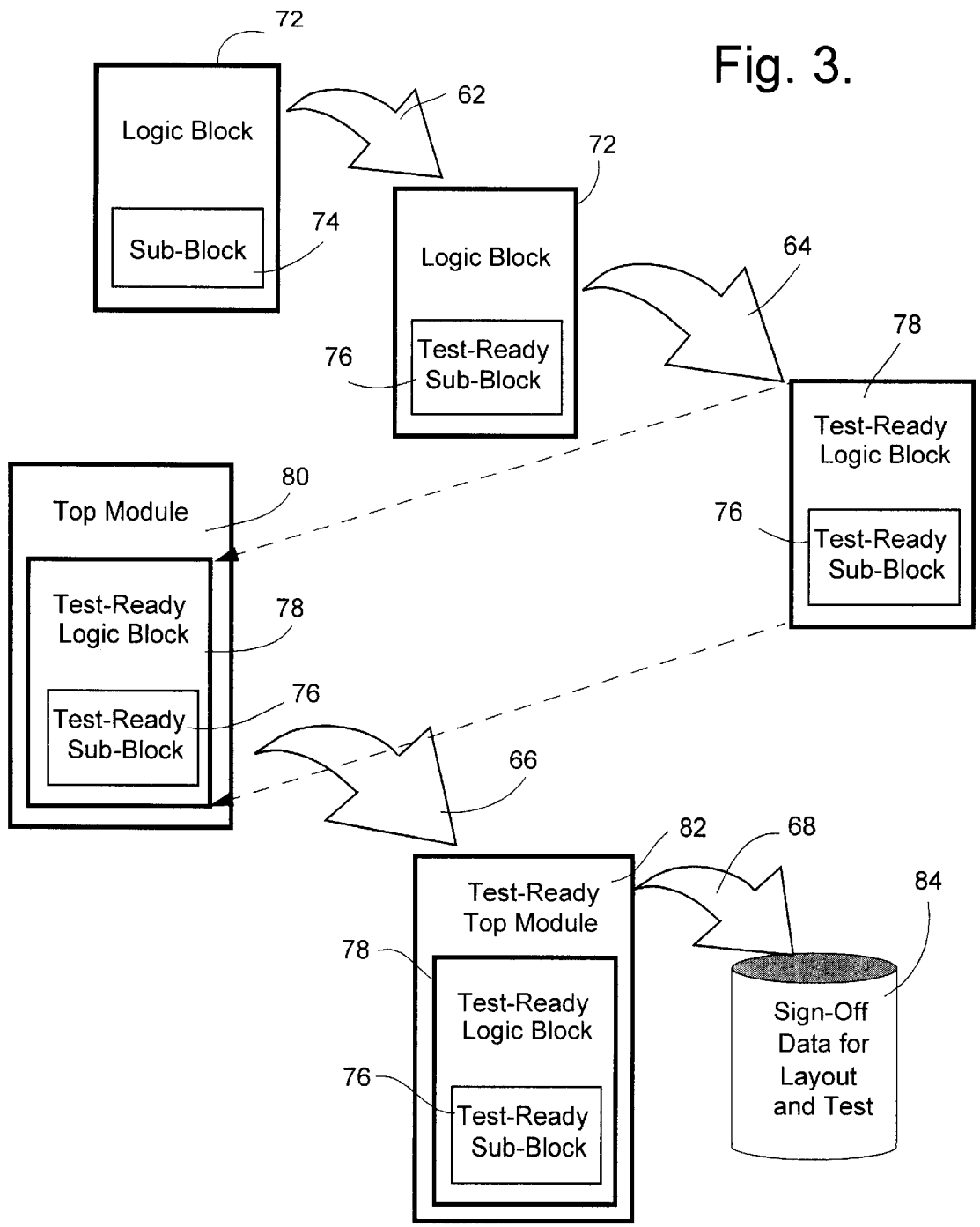
FIG. 3 is a more detailed diagrammatic view of the embedded test design flow according to an embodiment of the present invention.

Sub-blocks are components such as memories, phase-locked loops (PLLs), legacy cores, and the like. FIG. 3 illustrates a top-level logic block 72 having one sub-block 74. For simplicity, only one sub-block is shown. It will be understood by those skilled in the art that block 72 may include many sub-blocks which require specialized test structures, in which case the sub-block flow is performed on each sub-block.

In the sub-block flow, the embedded test structures include Built-In Self-Test (BIST) controllers for sub-blocks such as memories and phase-locked loops (PLLs), while, for sub-blocks such as legacy cores, the embedded test structures includes access and isolation mechanisms. The details of sub-block embedded test structures vary depending with the type of sub-block. This results in test ready sub-block 76.

A variety of electronic files are created during the course of performing the sub-block flow. These files may include, for example, a circuit description of the test structure, a description of its ports, test vectors for verifying the test structure, a test structure general information file which describes the various modes of operation of the test structure, and a modified description of the circuit block. Again, the details of these files is not important in order to understand the present invention. What is important is that a variety of files are created and these files must stored in a manner that will facilitate the complete design flow and use of the information contained in the files.

Prepare logic flow 64 prepares a top-level circuit block 72 for embedded test. In this phase, the embedded test structures associated with test ready sub-blocks 76 are made accessible at the top level of the circuit block, logic is rule-checked and made scannable, a logic test controller may be added and fault coverage is calculated. This phase results in a test-ready logic block 78 having one or more test ready sub-blocks 76. A circuit may include several top level blocks 72 which require preparation in this manner.

As with sub-block flow, the prepare logic flow results in the creation of a variety of files which describe the various structures and their connections within the circuit block, test vectors, and, of course, a further modified description of the circuit block. These files must be stored in a manner that will facilitate the complete design flow and use of the information contained in the files.

Top-Level Flow 66 completes integration of embedded test capabilities into a circuit design. In this phase, embedded test structures are added to the top-level module 80 of the circuit. The embedded test structures in this phase may include structures such as a test-access port (TAP), structures such as boundary scan, logic test controllers, and other embedded test capabilities. This phase results in a test ready top module 82 having one or more test ready logic blocks 78, each having one or more test ready sub-blocks 76. Circuit 60 may initially be in the form of several sub-circuits which are processed individually, resulting in a plurality of test ready sub-circuits 80.

Again, as with the sub-block flow and the prepare logic flow, the top-level flow results in the creation of a variety of files which describe the various structures and their connections within the circuit and, of course, a further modified description of the circuit block. These files must stored in a manner that will facilitate the complete design flow and use of the information contained in the files.

Each of the above flows includes various forms of analyses and verification procedures to ensure that the embedded test structures are individually functional and operable according to embedded test design. However, prior to manufacture, it is necessary re-verify all test structures. This is the purpose of embedded test sign-off flow 68.

Sign-Off Flow 68 creates and verifies a final circuit description, test vectors and test patterns for signing-off the embedded test structures of the circuit. In this phase, a concatenated, hierarchical circuit description and the final test vectors and test patterns are created for hand-off to manufacturing, a sign-off verification of the embedded test in the final circuit description is performed and a hand-off database 84 is created. The preferred sign-off flow is described and claimed in aformentioned application Ser. No. 60/354,015.

In each of the four phases, various automation, software tools perform various tasks, including generating test structures and access mechanisms, integrating test structures into the circuit design, analyzing a design with or without test structures, and verifying a circuit design that contains embedded test structures using simulating test benches. Each of the test structures is designed with at least one mode of operation and some modes may require several test steps which must be verified. The details of the test structures and modes of operation are not important for the purposes of the present invention.

Figure 4:
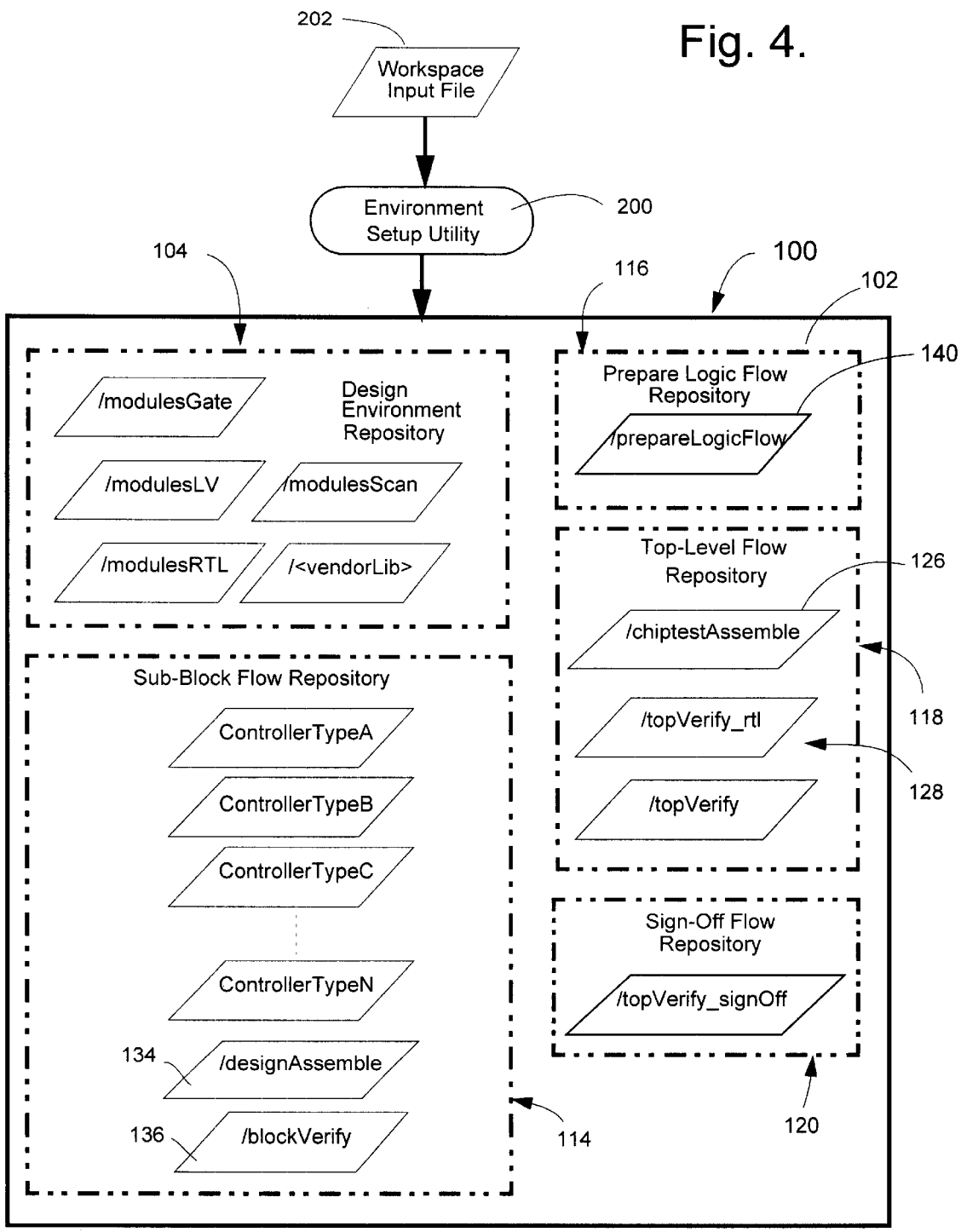
FIG. 4 is a diagrammatic view of a self-contained, circuit design framework for use in a computer readable storage medium for storing files on a computer readable storage medium according to an embodiment of the present invention.

Referring to FIG. 4, the present invention provides a self-contained framework or workspace 100 for a top-level circuit block of a circuit. The workspace is for use in generating, analyzing and verifying the large number of files which are created in the above-described embedded test design flow. For a circuit formed of two or more circuit blocks, each circuit block is provided with substantially the same workspace organization, differing only in detail. To facilitate creating the workspace, another aspect of the present invention relates to a test environment setup utility 200 which operates under control of a workspace input or configuration file 202, as described later. The setup utility creates the workspace on a computer readable storage medium.

As mentioned, the self-contained, circuit design framework 100 is created on a computer readable storage medium (not shown) for storing test files associated with designing a circuit block according to a design flow having a plurality of phases, with the files being generated by design automation tools (not shown). The framework comprises a circuit block repository 102 having design environment repositories 104 containing links to design library repositories and files so that all scripts referring to the repositories and files use a relative path to the links contained within the design environment repositories; design phase repositories for each phase of the plurality of design flow phases; a process control file in the circuit block repository and each design phase repository for use in performing predetermined operations; a process information file corresponding to each process control file and describing the operations; and a design phase configuration file in each design flow repository for use in specifying design flow options and parameter values.

A repository may correspond to a computer operating system directory and may include one or more sub-directories. In the preferred embodiment of the present invention, the design phase repository comprises a sub-block flow repository 114 for files associated with generating and verifying sub-block test structures and assembling the sub-block test structures into the circuit block, a prepare logic flow repository 116 for files used for rule analyzing design files, calculating fault coverage, adding test points and/or scan chains to the circuit block and verifying logic test structure operation, a top-level flow repository 118 for files associated with generating and verifying top-level test structures and assembling the top-level test structures into the circuit block; and a sign-off repository 120 for use in performing a final verification of all test structures, generating final test patterns and storing signed-off files. The above-mentioned repositories may reside in a common directory or may be provided in separate directories.

Design Environment Repositories

The design environment repositories include a directory for each different type of design and/or library files. FIG. 10, described later, provides examples of a variety of design file or libraries which may be required. These directories may store the actual file or library or store a link or pointer to the source location of files or libraries. The link may be a hard link or soft link. The design environment repositories may include a modulesGate directory to provide links to all directories that comprise a complete gate-level description of the circuit or chip, for a non-hierarchical embedded test design flow, or of a core, for an hierarchical embedded test design flow. The modulesGate structure assumes that all gate-level files can be located within this directory.

RTL and gate-level descriptions of the generated embedded test design objects or structures created by a test structure generate tool are stored in separate output directories associated with each design phase directory.

A modulesLV directory may be provided with links to directories containing special simulation models used by some tools and implemented with a selected vendor library. For example, this directory may be used to identify priority data holding scan flip-flops and testpoints generated by a scan generating tool when creating libraries for scan test or logic BIST.

A modulesRTL directory may be provided for links to all directories that comprise a complete RTL description of the circuit. The directory may be organized into links to subdirectories, provided that all RTL files can be located below this directory.

As explained more fully later, during the generation, verification, integration, and synthesis of circuit designs and test structures, all accesses to design files or libraries are made to the design environment repositories, and, thus, there is no need to access files outside of the circuit block repository. In this way, the framework is self-contained and can be easily copied or moved to another location without loss of functionality.

Sub-Block Flow Repository

FIG. 4 illustrates sub-block flow repository 114. Repository 114 provides a repository or directory for each type of sub-block test structure. Thus, for example, a directory is provided for memory test controllers, a separate directory is provided for phase-locked-loop test controllers, another directory for logic test controllers, and so forth. These are represented by ControllerTypeA-ControllerTypeN in the figure.

Figure 5:
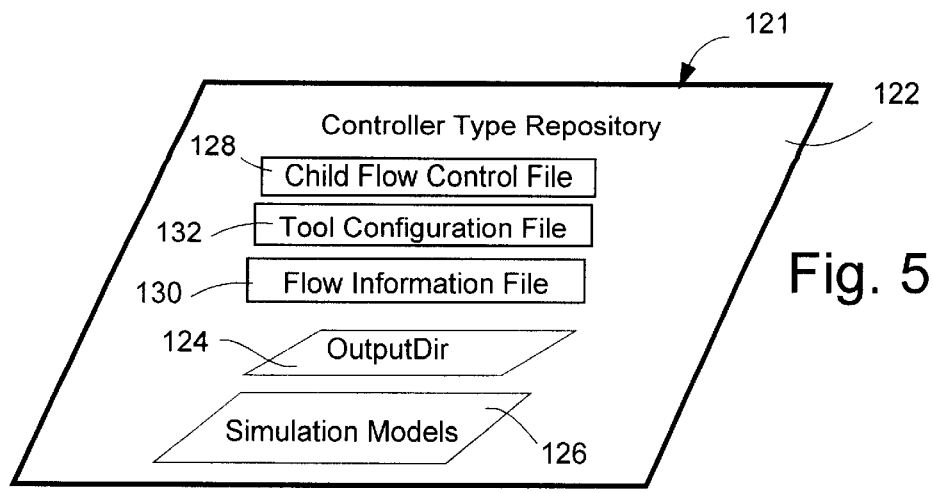
FIG. 5 is a diagrammatic view of a test structure type repository for use in a sub-block flow repository according to an embodiment of the present invention.

FIG. 5 illustrates a typical controller type repository 121. The repository includes a "Generate" directory 122, which may be the parent directory of repository 121, and one or more output directories 124 for storing generated sub-block test structure files. Another directory 126 may be provided for storing simulation models, if any, of the sub-block. More specifically, directory 126 stores links to design environment repositories which, in turn, store links to the actual locations of the simulation models. The Generate directory contains a child process control file 128, a process information file 130 and a generate automation tool input or configuration file 132 that is used by the user to specify test structure optional features and parameters. A test structure information file that describes the design object is created automatically by the generate tool and stored in the output directory.

The sub-block flow repository 114 further includes a sub-block test structure assembly flow repository 134, labeled designAssemble, for use in merging or integrating the generated descriptions of the sub-block test structures into the circuit block description, and a sub-block verification flow repository 136, labeled blockVerify, for verification of test structures integrated into the circuit block. Each of these repositories includes a child process control file, a process information file and a starter test structure configuration template.

Prepare Logic Flow Repository

Prepare logic flow repository 116 is comprised of a parent directory 140, labeled prepareLogicFlow, and an output sub-directory 142 which stores files generated by a corresponding automation tool. The parent directory stores a prepare logic flow process control file, process information file and input starter template (not shown). The parent directory is a directory in which all steps of the prepare logic flow are performed. Generally, this flow involves rule analyzing logic, and fault coverage calculation, adding testpoints and scan chains to the top-level logic of the circuit block. The flow also involves generating testbenches and simulating the scan chains to verify correct operation. If there is only one top-level logic block in the circuit, automation tools are run or executed in the prepareLogicFlow directory. An output sub-directory (not shown) is also provided in prepareLogicFlow directory to hold scan-related files associated with a unique top-level logic block. If there are several top-level logic blocks, a specific output sub-directory is provided for each top-level logic block. Once all of the prepare logic flow test structures have been generated, the description of the circuit block is modified and the modified circuit block description is stored in an appropriate directory in the design environment repositories.

Top-Level Flow Repository

The top-level flow repository 118 includes a top-level test structure generation flow repository 126 for files associated with generating top-level test structures and for assembling the top-level test structures into the circuit block; and a top-level verification flow directory 128 for files associated with verification of a circuit block. Directory 128 may comprise two directories, as shown, including a directory, labeled topVerify_Rtl, for RTL verification of the top module and a directory, labeled topverify, for gate-level verification.

Sign-Off Repository

The sign-off flow repository 120 is provided for storing sign-off files such as a concatenated netlist for a complete circuit design, a final set of test vectors for logic testing of the circuit block, test patterns for all the embedded test structures in the circuit, timing analysis scripts for performing analysis of the embedded test structures in the circuit, and test benches for performing simulation of all embedded test structures through a top level of the circuit block.

The framework may also include a repository for storing a hand-off database containing selected files from the various design flow repositories. The selected files may include descriptions of all test steps that are to be performed during manufacturing test; descriptions of test-collared versions of the circuit sub-blocks and of connections of collared sub-block test points; descriptions of external scan chains in the test-collared test sub-block; descriptions of periphery logic of the test-collared blocks added to sub-blocks; descriptions of all embedded test capabilities of the circuit block. The selected files further include descriptions of any specified physical constraints to enable grouping and port polarity. Still further, the selected files include descriptions contained in a boundary scan description language (BSDL) file generated during generation and integration of the top-level test structures into the circuit block.

Process Control Files

The process control files include a top-level or parent file process control file containing automation tool command-line runtime options that execute the complete, embedded test design flow, from sub-block flow through to sign-off flow, from the top module of the chip design; and lower-level or child process control files containing scripts of automation tool command-line runtime options for executing a step, a set of steps, or a full phase of an embedded test design flow. The script that the user executes depends on a defined target that the user chooses for use with a UNIX make command.

In a preferred embodiment of the present invention, the process control files are in the form of "makefiles" containing a variety of targets for running one or more automation tools using UNIX operating system "make" command. However, as will be appreciated by those skilled in the art, in a number of other ways. These process control files offer optimal flexibility in that they are relative, compact, and user-editable. The files operate at any level of the design hierarchy, for individual sub-blocks or for the top-level logic block. The makefiles combine several design flow steps into a single step, allowing the user to run multiple automation tools with one executable. The syntax within the makefiles reflects the same syntax that the user would type from an operating system shell.

Figure 6:
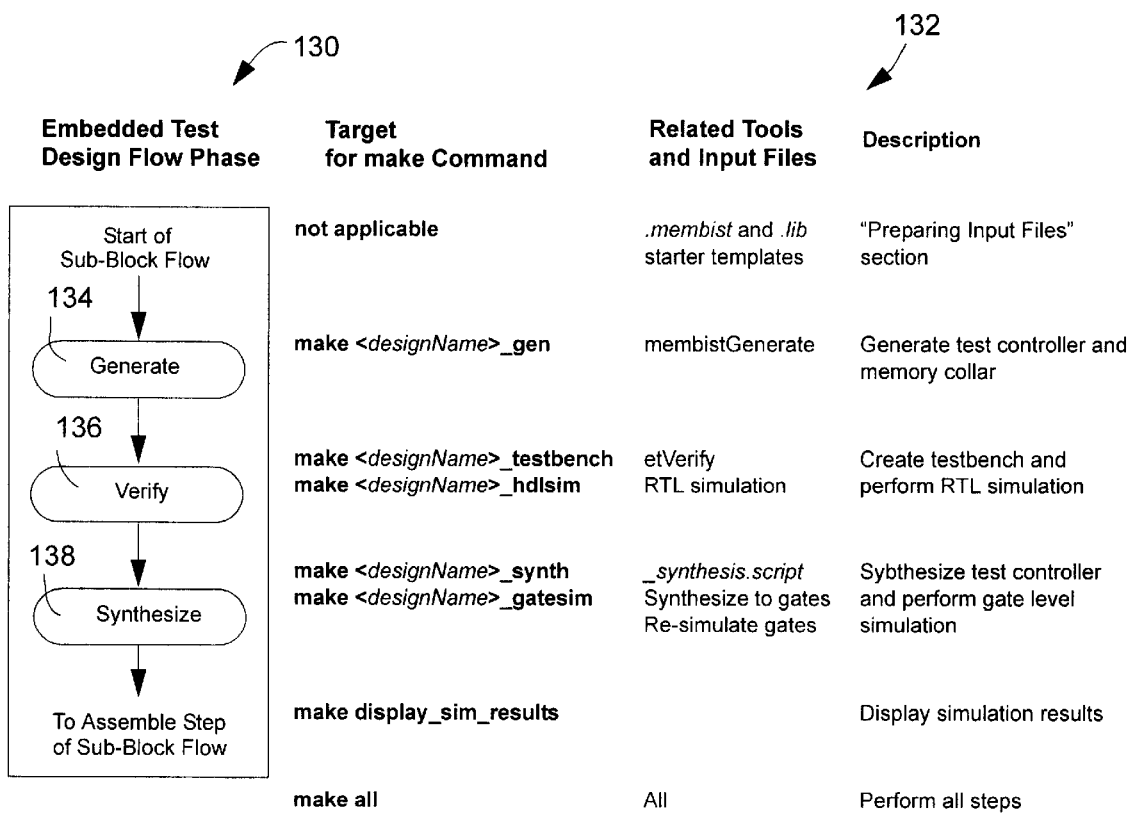
FIG. 6 illustrates a flow diagram and table corresponding to a process control file for a memory test controller sub-block design flow, according to an embodiment of the present invention.

FIG. 6 diagrammatically illustrates a process control file for a memory test controller sub-block design flow. The makefile and design flow are typical of many of the test structure type flows of the sub-block flow. The figure is comprised of a small flow diagram 130 and a table 132. As shown in the flow diagram, the flow comprises a Generate step 134, which generates an RTL version of test structure design files, a verify step 136, which verifies the generated test structure, and a synthesis step 138 which synthesizes the test structure design files. As can be seen from the table, the process control file contains seven specific steps. A "make" command is associated with each of these steps. For example, the "make <designName>_hdisim" command runs an RTL simulator tool on a generated memory test controller. For simplicity, the table in the figure does not show the complete script for the commands. In practice, scripts may include several runtime parameters. Some parameters contain references to library files or directories, or to a hand-off database of an embedded circuit block. For example, the actual script of the simulation command may be as follows:

<designName>_rtlsim:
cd outDir;\
./<designName>_assembly_sim.script\
−y.\
+libext+.vb+.v\
−f./../VirtexE/VerilogOptions\
−y./memoryModels/MemWrappers\
−y./memoryModels/MemCores\
−y./memoryModels/MemFIGates\
−logext_rtl\
${cmdOptions}

The bolded parameters in the script above are links to design environment repositories which reside within the circuit block repository.

The memory test controller tool, called "membistGenerate" in FIG. 6, reads and parses a starter template which contains user editable options and parameters. It will be noted that one step is associated with the "Generate" block in the diagram and two steps are associated with each of the "Verify" and "Synthesize" blocks in the diagram. One command, "make all" will cause all of the other commands to be executed in the sequence shown.

As indicated above, all such references are relative to files, directories or databases which reside within the circuit block repository or workspace. Thus, the generated design environment and process control files are not hard-coded but, rather, are relative, this providing the ability of replicating the workspace easily at other locations. The ability to replicate the workspace—in part or in its entirety—provides a common environment between design teams and makes design information easily accessible for review, implementation, and debug. This common environment can also be used when the user needs to replicate issues for technical support.

The links to library directories and files are provided so that all scripts can refer to this design information using a relative path which resides within the directory structure. Such references allow the user to use a command such as the UNIX "tar-h" command on the directory and regenerate the entire design environment and directory structure at another location without modifying any scripts.

The process control files are created by the environment generation utility of the present invention. The utility also enters the relative path links into the process control files using information entered into a workspace configuration file as described later.

Design Environment Setup Utility

The present invention provides an automation tool or utility 200 for use in creating a self-contained design environment workspace, such as described above, for easily performing an embedded test design flow and operating design automation tools on a circuit. The complete environment that utility creates is the above described workspace. This utility creates the following entities to assist a designer in implementing embedded test structures into a circuit design. The entities include an environment with links to design data, a repository or directory structure, grouped according to design flow and design data for ease-of-use and quick access and, within each directory, files to guide the user through the design flow. The files include the above described process control files, preferably in the form of make files with a variety of targets for running one or more automation tools using UNIX make commands, starter templates or initial configuration file templates that a user customizes according to a preferred design, and process information files, in the form of readme files, that explain the steps the user needs to perform.

The utility constructs a set of directories according to a user's selected design flow.

The directories generated by the utility contain design information and makefiles for automating the execution of automation tools within a design flow or for the entire design. The utility generates one main Makefile, referred to as the parent Makefile, that can execute the entire embedded test design flow. Thus, regardless of the number and type of test structures to be integrated into the circuit, all structures can be created, verified and assembled into the circuit with a single command. The parent Makefile is stored in the parent circuit block directory. Additionally, the utility generates child makefiles that execute one or more steps in a given phase of the embedded test design flow.

Figure 7:
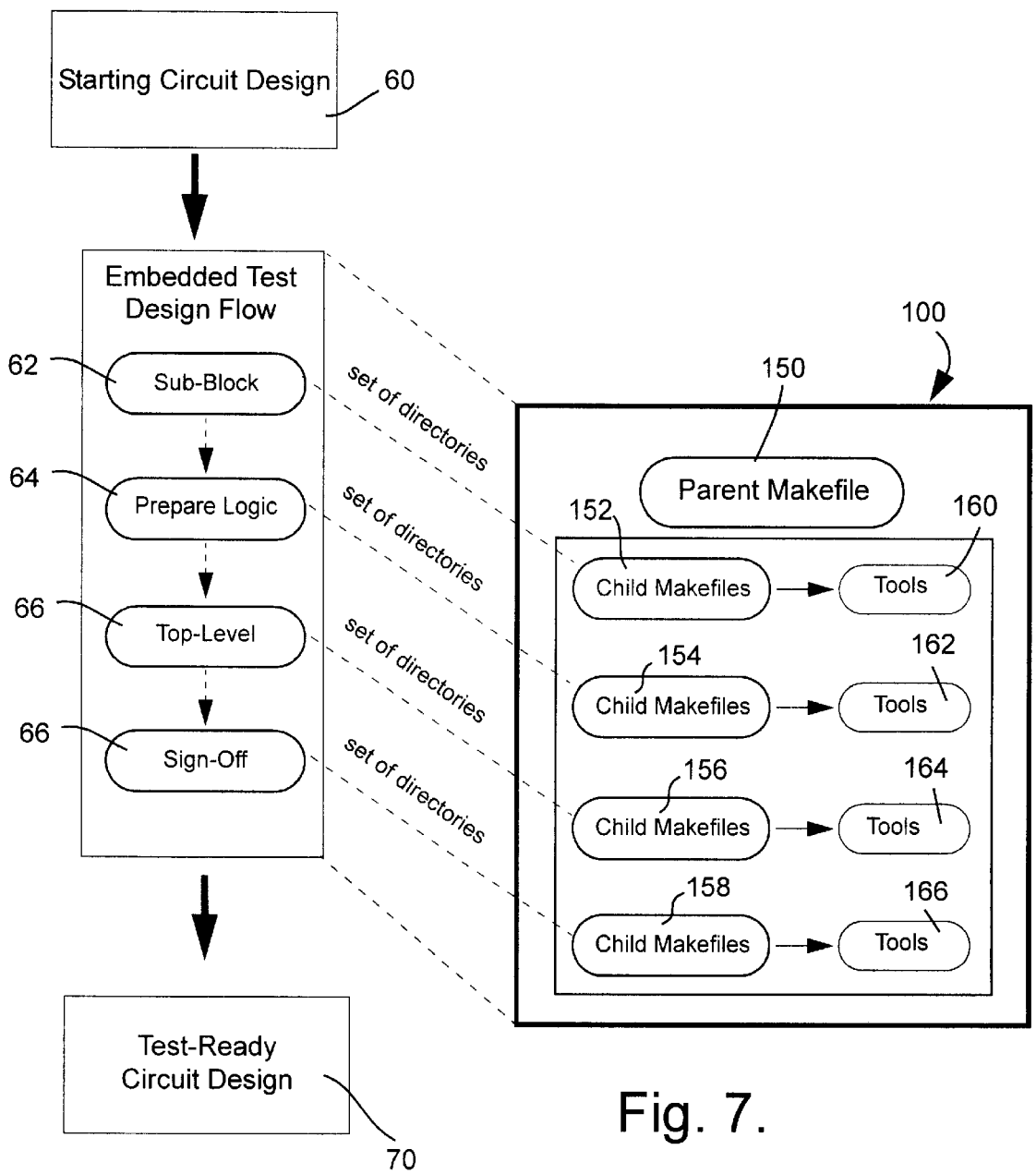
FIG. 7 diagrammatically illustrates the relationship between the four embedded test design phases, the repositories created by the embedded test setup utility, process control files and automation tools.

FIG. 7 diagrammatically illustrates the relationship between the four embedded test design phases described earlier, the directories created by the utility, the makefiles, and automation tools. The figure illustrates a starting chip design 60 which does not contain test structures, the four phases 62, 64, 66 and 68 of the embedded test design flow, and a resulting test ready chip design 70 containing all embedded test structures. The environment setup utility creates a set of directories for each of the sub-block flow, the prepare logic flow, top-level flow and sign-off flow, as indicated above, and populates these directories with process control files 150, 152, 154, 156 and 158 and process information files (not shown). A parent process control file 150 is located in the in the circuit block parent repository as mentioned earlier. There may be a number of sub-block flow sets of directories depending on the number of sub-block test structures types which are required. The process control files contain commands for running a variety of automation tools 160, 162, 164, and 166.

Structuring Circuit HDL for the Utility

The utility manages HDL files and file extensions to facilitate the insertion and verification of embedded test structures. In order to use the utility, the HDL design files should be structures sot that the HDL module for the top of the chip is in a separate file. This module is assumed to be a gate-level module, with no RTL. The top of the chip will undergo the Top-Level Flow. Any flops in the top-level module, whether in the I/O region or in glue logic, should be grouped into separate HDL modules in separate files. These modules will each undergo the Prepare Logic Flow for scan insertion. Each HDL module for a top-level logic block or hierarchical core should be in separate file. Each top-level logic block will each undergo the sub-block flow and prepare logic flow. For maximum ease of use, top-level logic blocks should be grouped into a single top-level logic block within the top module of the chip or core.

Understanding How the Utility Operates

The utility requires a single input file that the user creates using a starter template generated by the utility. The utility creates the input file in response to a user command. The command specifies the name of the circuit, a target type and each sub-block test structure desired for the specified target type. The utility responds to this command by generating the input file, described later. The user may then edit and re-save the input file. When the utility is executed, the utility reads and parses the input file and creates a workspace according to the contents of the input file, i.e., a workspace containing grouped directories and makefiles for automating many steps in the embedded test design flow.

The utility supports a number of different subsets of a complete embedded test design flow or hierarchical embedded test design flow. These subset flows allow the user to customize the workflow for optimal use with a given portion of the flow and a subset of the available embedded test capabilities. The type of flow the utility implements is based on a "target type" specified by the user. The target type refers to the portion of a circuit design to which the user desires to add a set of embedded test capabilities and then verify and sign-off. The available target types are described below.

A target type called Top is used to create a workspace for a top-level logic block and the top of the chip. This flow involves the use of a IEEE 1149.1 Test Access Port at the top of the chip and, optionally, a selection of any other embedded test capability. All flows of the embedded test design flow are available when using this target type.

A target type called Block is used to specify a workspace for a block in the circuit, which could be any block including the top of the chip or any lower level block of the chip. This target type does not use any IEEE 1149.1 Test Access Port or Boundary Scan, and is generally limited to supporting a subset of embedded test capabilities, such as memory BIST and scan test.

A target type called LegacyCore is used to specify a workspace for adding a test collar for isolation and access to an existing legacy core.

A target type called EmbeddedLogicTestCore is used for a workspace for a logic core that will have embedded logic test added and that will be encapsulated so as to be self-testing and reusable in a fully hierarchical manner. This target type is intended for a block used in a hierarchical embedded test design flow. In this subset of the flow, the top-level flow is replaced with the embedded logic flow.

In addition to the type of flow, the utility may be used with only a subset of the complete suite of embedded test capabilities. Appropriate options and properties are provided in the utility to specify the mix of embedded test capabilities to include in the specified target type.

Figure 1:
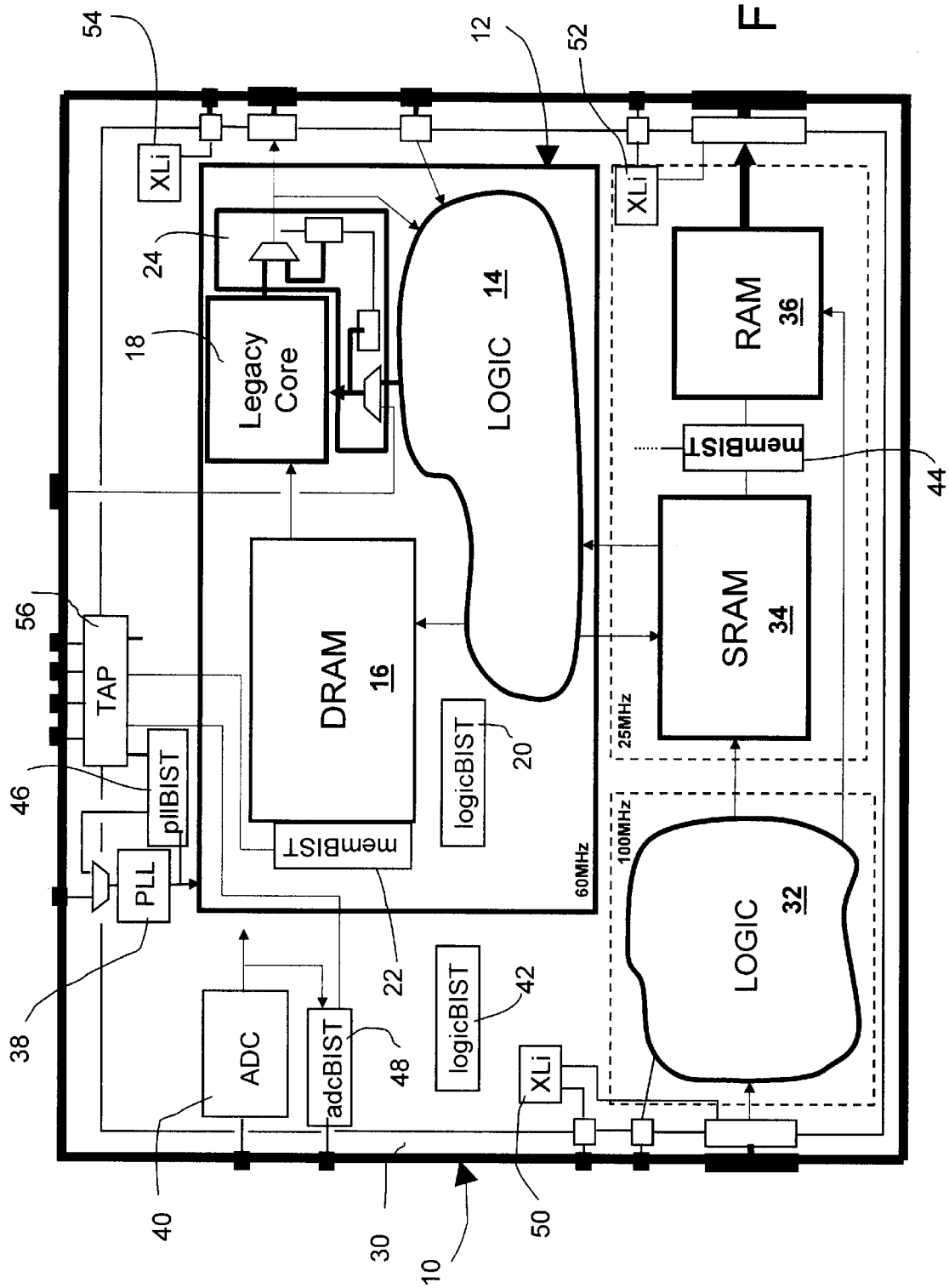
FIG. 1 is a diagrammatic view of a circuit having an embedded circuit block and a plurality of specialized test structures.

For the circuit illustrated in FIG. 1, two workspaces would be created. A first workspace would be created for embedded block 12 and another workspace for the top module of circuit 10. The target type for block 12 would be the EmbeddedLogicTestCore type, while that for the top module of circuit 10 would be the Top target type. Using an appropriate interface (command line or graphical user interface), the user would specify the desired test structures. For example, for embedded core 12, the user would request a core socket (for the legacy core), a logic test controller and a memory test controller. For the top module, the user would request, a TAP, a PLL test controller, a logic test controller, a memory test controller, and an interconnect test controller. In addition, the user will specify that the top module has an embedded core. Each of these requested items are associated with sub-blocks which will undergo the sub-block flow using specialized automation tools.

In an embodiment of the invention, a single workspace configuration file defines customization options for implementing the entire embedded test design flow for a specified circuit block. The customization options the user specifies dictates the output that the utility generates. The customization involve global parameters, desired design flow, environment setup, and embedded test requirements. This input file allows the user to provide pointers to all design files which comprise the user's complete netlist. These pointers instruct the utility in making the links to design data. All makefiles generated by the utility call the user's cell models through the workspace design environment directory dedicated to specified vendor library information.

Initially, the user instructs the utility to generate a starter template of the workspace configuration file, as described above with reference to blocks 10 and 12 of circuit of FIG. 1. The user then edits the starter template to delineate global conditions, design environment, target type, and design flow specifications.

The utility automatically reads and parses the workspace configuration file on startup and then builds a workspace according to the specifications contained in the configuration file. The user then uses the output of the utility to implement the embedded test design flow requirements specified in the workspace configuration file.

Using the utility to implement a design flow for embedded test comprises the following steps:

1. Set the current directory to the generated directory associated with the first step in the design flow. For example, if the user is implementing a sub-block flow for a test controller called ControllerA, the user would change to a directory called controllerAGenerate.

2. Read the Test ControllerA information File in the directory to understand what needs to be done.

3. Edit the generated starter template for any of the required input configuration files in the working directory.

4. If necessary, edit command-line runtime options in the process control makefile in the working directory, if some of the command line options need to be customized.

5. Run the UNIX make command with the appropriate target contained in the process control file in the current directory to run a step or set of steps in the design flow. Alternatively, all steps/targets can be executed with one command, "make All", as previously described.

Steps 1 through 5 are repeated for each generated directory associated with the design flow.

Alternatively, all design flows in all directories can be performed with one command from the parent process control file located in the workspace main directory and specify target "All". This will cause all of the process control files in the workspace to be executed in a predetermined sequence, which means that all required test controllers and other sub-block will be generated, individually verified, assembled into the circuit block netlist, and verified from the top of the circuit block.

Design Environment Setup Utility

Figure 8:
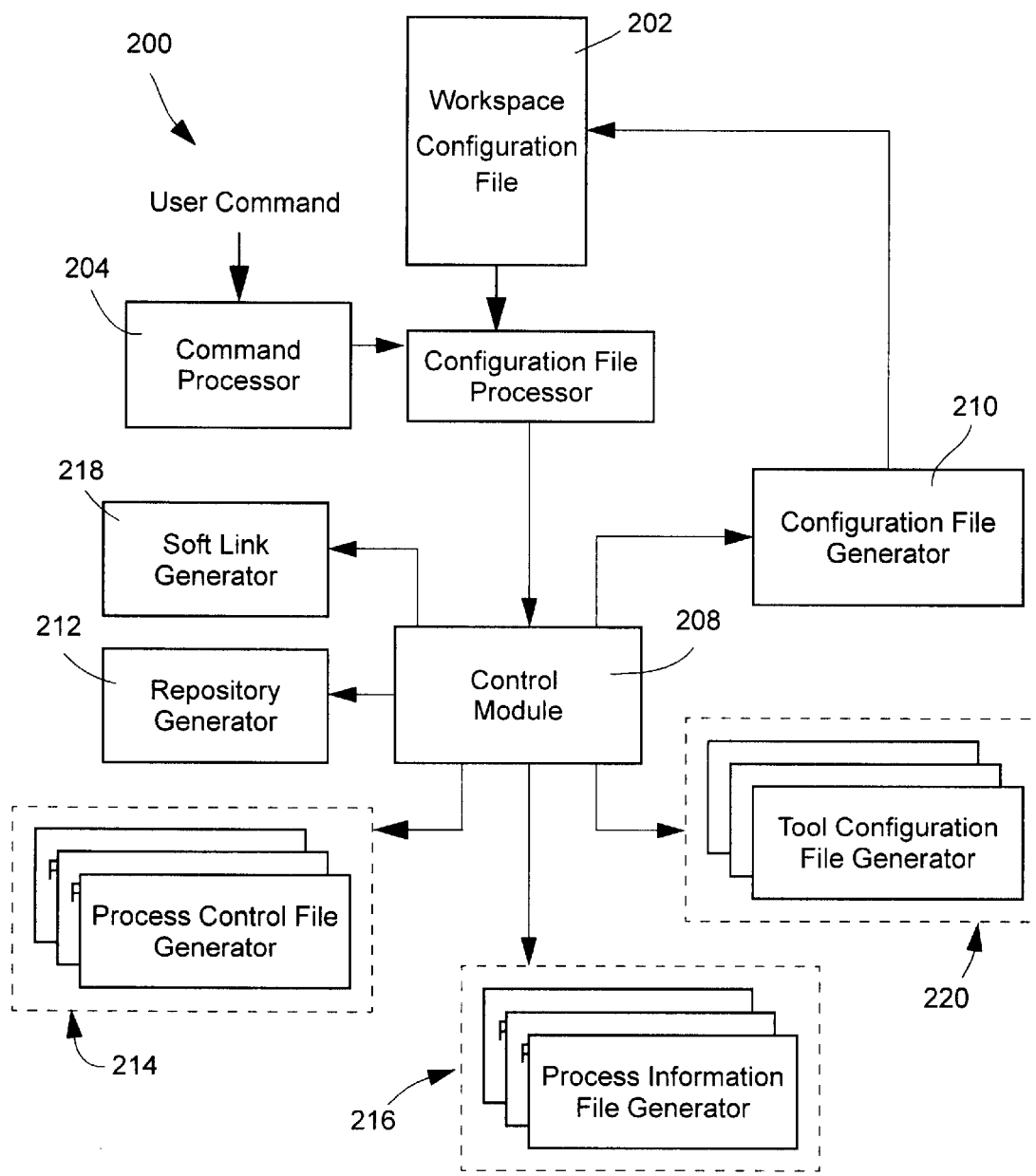
FIG. 8 is a block diagram which illustrates the major components of the design environment setup utility, according to an embodiment of the present invention.

FIG. 8 diagrammatically illustrates the major components of the design environment setup utility. The setup utility is implemented on a computer-usable medium storing computer-executable instructions or program code segments which when executed perform operations necessary for creating the workspace described above.

The utility includes a command processor 204 which parses user commands, assigns parsed data to predetermined parameters and transfers control to a configuration file processor 206 which parses workspace configuration file 202, if it exists, assigns data to predetermined configuration file parameters and then transfers control to control module 208. If a configuration file has not yet been created, the control module returns an error message to the user indicating the command syntax for generating a configuration file. The command line parameters and configuration file parameters enable the control module to determine the operations to be performed.

A configuration file generator 210 generates the workspace configuration file in response to an appropriate command and parameters input by a user. The parameters may be input in a command line for a command line based utility or may be entered on a computer screen for a graphical user interface based system. In either case, the user will specify a target type and specific test structures available with the specified target type. This is described more fully later.

A repository generator 212 creates repositories based on the parameters specified in the workspace configuration file. The repositories created include a main repository for the circuit block being processed and, within that repository, the various repositories described earlier.

A process control file generator 214 creates a process control file for each of predetermined repositories and stores the process control files in the corresponding repositories. Preferably, generator 214 comprises a process control file generator for each specific process control file required so as to facilitate the addition of new test structures and modification of existing test structure tools. However, the generator may comprise a single module. As previously mentioned, the process control files generated are based on the embedded test structure specifications section of the configuration control file.

A process information file generator 216 creates a process information file corresponding to process control file stores the files in corresponding in their appropriate repositories. As with the process control file generator, Preferably, information file generator 216 comprises an information file generator for each specific information file required so as to facilitate the addition of new test structures and modification of existing test structure tools. However, the generator may comprise a single module.

A link generator 218 creates links for the various files, repositories, libraries and embedded logic blocks specifications contained in a design environment section of the workspace configuration file and stores the links as pointers in corresponding design environment repositories created by repository generator 212.

A test structure configuration template generator 220 creates a starter configuration template for each test structure specified in an embedded test specification section of the workspace configuration file 202. These templates allow a user to specify desired test structure options and parameters. Generator 220 comprises a starter template generator for each specific starter template required so as to facilitate the addition of new test structures and modification of existing test structure tools.

It will be appreciated by those skilled in the art that the above described segments may be designed in a number of different ways without departing from the spirit of the present invention. For example, instead of specialized segments as described above, a segment could be provided so that it performs a number of the functions on a test structure basis. In other words, segment could create the repository, process control files, process information files, and starter template for its respective test structure.

FIGS. 9–11 illustrate a representative workspace configuration file for a target type "Top". The template generate command includes parameters for specifying a target type, and the specific test structures to be incorporated into the circuit. The specific test structures specified must be compatible for the specified target type.

The workspace configuration file contains a "Global Options" section which defines global conditions which will be in effect throughout implementation of an embedded test design flow of the circuit block. This section is shown in FIG. 9 and specifies a repository name, the circuit HDL language used, the identity of the simulator to be used during verification, test pattern format and the like.

FIG. 10 shows a Flow Specification section. This section specifies the target type. A Design Environment Options section, also shown in FIG. 10, defines design environment parameters including a name for each of predetermined design files and libraries and a corresponding path to a location of the design data. The repository generator uses this information to create corresponding directories within the circuit block main directory. The design environment section also identifies any embedded circuit blocks, and provides the name of the embedded circuit block and of its top module, the location of its concatenated netlist, as well as particulars of modules contained within the embedded block.

Finally, an Embedded Test Specification" section, shown in FIG. 11, identifies the specific test structures to be incorporated into circuit block 10 of FIG. 1. This section contains a wrapper for each specified test structure and includes test structure design parameters and a corresponding default value for each parameter. For clarity, wrappers are shown only for memory test controller 44 and PLL test controller 46. The parameters and values are used by an associated test structure generation tool and are used by the starter template generator for generating corresponding starter templates. It will be seen that the test specification section includes a "PrepareLogicFlow" wrapper and a "TopFlow" wrapper, in addition to the specific test controller wrappers. It will be appreciated that other target types could be added without departing from the spirit of the invention.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A circuit design environment setup utility for use in creating a self-contained, design-for-test workspace on a computer readable storage medium for storing design-for-test files associated with a circuit block, comprising:

means for generating a circuit block repository on said storage medium, said circuit block repository including a repository for each of predetermined design-for-test flows;

process control file generating means for generating a process control file for predetermined repositories for use in performing predetermined design-for-test operations; and means for creating soft links to repositories for circuit design files, library files and databases of blocks embedded in said circuit block and storing said soft links in said circuit block repository.

2. A circuit design environment setup utility as defined in claim 1, further including means for generating and storing in each said predetermined repository a process information file associated with each said process control file and describing said operations.

3. A circuit design environment setup utility as defined in claim 1, further including means for generating and storing starter test structure configuration files.

4. A circuit design environment setup utility as defined in claim 1, said means for generating a circuit block repository, including:
   means for generating sub-block flow repository;
   means for generating a prepare logic flow repository;
   means for a generating top-level flow repository; and
   means for generating a sign-off repository.

5. A circuit design environment setup utility as defined in claim 4, wherein
   said sub-block flow repository being for storing files associated with generating, verifying and assembling said sub-block test structures in said circuit block;
   said prepare logic flow repository being for storing files associated with rule analyzing circuit block logic according to design rules, calculating fault coverage, adding test points, creating scan chains and verifying logic test structure operation;
   said top-level flow repository being for storing files associated with generating assembling said top-level test structures into said circuit block and verifying all structures inserted into said circuit block; and
   said sign-off repository being for verified test structure files.

6. A circuit design environment setup utility as defined in claim 4, said means for generating a sub-block flow repository being further operable to generate:
   a sub-block test structure assembly repository for files associated with merging sub-block test structures types into a circuit description of said circuit block; and
   a verification repository for files associated with verifying all sub-block test structures types.

7. A circuit design environment setup utility as defined in claim 4, said means for generating sub-block flow repository being further operable to generate a repository for each of one or more types of sub-block test structures.

8. A circuit design environment setup utility as defined in claim 4, said means for generating a top-level flow repository being further operable to generate:
   a repository for files associated with said top-level test structures; and
   a top level verification repository for files associated with verification of test 5 structures in said circuit block.

9. A circuit design environment setup utility as defined in claim 4, said means for generating a circuit block repository further including means for generating circuit block design environment repositories for design files and libraries and storing therein soft links to said design file and libraries.

10. A circuit design environment setup utility as defined in claim 1, said process control file generating means being operable to generate process control files containing commands for performing predetermined operations, said commands including automation tools commands for generating, verifying and assembling test structures into said circuit block.

11. A circuit design environment setup utility as defined in claim 10 said commands being arranged into targets, each target corresponding to a phase of a corresponding design flow and comprising a predetermined sequence of automation tool commands for performing said operations, each said target being executable independently of other targets or executable in a sequence.

12. A circuit design environment setup utility as defined in claim 1, said soft links pointing to associated library storage locations and files and said commands referring to library storage locations using a relative path contained within said design environment repositories.

13. A circuit design environment setup utility as defined in claim 1, further including means for generating a workspace configuration file.

14. A circuit design environment setup utility as defined in claim 13, said means for generating a workspace configuration file including means for inserting into said configuration file:
   a global options section defining global conditions in effect throughout implementation of an embedded test design flow of said circuit block;
   a design environment options section defining design environment repositories to be included in said workspace, environment parameters and relative links indicating a path from said design environment repositories to a location of design data;
   a design flow options section specifying a design module target type indicative of test structure types to be integrated into said circuit block; and
   a test structure requirements section identifying test structures to be incorporated into said circuit block.

15. A circuit design environment setup utility as defined in claim 14, each said test structure requirements section including test structure design parameters corresponding to a test structure type and a default value for each said parameter.

16. A circuit design environment setup utility as defined in claim 14, further including means for inserting descriptive comments into said workspace configuration file.

17. A circuit design environment setup utility as defined in claim 14, said means for generating a workspace configuration file being responsive to a target type specified in a utility command line option for generating a workspace corresponding to a predetermined block design-for-test flow.

18. A circuit design environment setup utility as defined in claim 17, said target type including a top module design flow for use in specifying top module test structures to be added to a top module of said circuit block, said top module test structures including one or more of a test access port, boundary scan cells, and a top-level logic test controller.

19. A circuit design environment setup utility as defined in claim 17, said target type including a sub-block design flow for specifying sub-block test structures for sub-blocks in a circuit block.

20. A circuit design environment setup utility as defined in claim 17, said target type including a legacy core design flow for specifying test access and isolation for a legacy core circuit block.

21. A circuit design environment setup utility as defined in claim 17, said target type including an embedded logic core design flow for integrating logic test circuitry into a core and encapsulating said core in a collar so as render said core to be self-testing and reusable in a hierarchical manner.

22. A circuit design environment setup utility as defined in claim 14, said design environment options section defining a name and location of each of predetermined libraries, files, and repositories and workspaces of blocks embedded in said circuit block.

23. A circuit design environment setup utility as defined in claim 1, further including means for parsing a workspace configuration file.

24. A circuit design environment setup utility as defined in any one of the preceding claims, each said means being a computer executable program code segment.

25. A self-contained, circuit design framework for use in a computer readable storage medium for storing files associated with designing a circuit block according to a design flow having a plurality of phases and using design automation tools for generating said files, said framework comprising:
- a circuit block repository having:
  - design environment repositories containing soft links to design libraries and files so that all scripts referring to said design libraries and files use a relative path to said soft links contained within said design environment repositories;
  - a design flow repository for each phase of said plurality of design flow phases;
  - a process control file in said circuit block repository and each said design flow repository for use in performing predetermined operations; and
  - a design flow configuration file in each said design flow repository for use in specifying design flow options and parameter values.

26. A self-contained embedded test design framework as defined in claim 25, further including a process information file corresponding to each process control file and describing said operations.

27. A self-contained embedded test design framework as defined in claim 25, wherein the process control file in said circuit block repository is a parent process control file for executing all of said design flow phases.

28. A self-contained embedded test design framework as defined in claim 25, each said process control file containing one or more selectable targets for executing a corresponding sequence of steps of said corresponding design flow phase.

29. A self-contained embedded test design framework as defined in claim 25, said design flow repository being a design-for-test repository including:
- a sub-block flow repository;
- a prepare logic flow repository;
- a top-level flow repository; and
- a sign-off flow repository.

30. A self-contained embedded test design framework as defined in claim 29, said sub-block flow repository being for storing files associated with generating and verifying sub-block test structures and assembling said sub-block test structures in said circuit block; said prepare logic flow repository being for storing files used for rule analyzing design files, calculating fault coverage, adding test points and/or scan chains and verification of logic test structure operation; said top-level flow repository being for files associated with generating and assembling top-level test structures into said circuit block and verifying all test structures in said circuit block; and said sign-off flow repository being for verified test structure files.

31. A self-contained embedded test design framework as defined in claim 29, said sub-block flow repositories including:
- a repository for each type of sub-block test structure, each said sub-block test structure type repository including:
  - a sub-block test structure generation flow repository for use in generating said sub-block test structure; and
  - a sub-block test structure output repository for storing generated sub-block test structure files and for verifying said sub-block test structure prior to assembly thereof into said circuit block;
- a sub-block test structure assembly flow repository for merging sub-block test structures into said circuit block; and
- a verification flow repository for verification of test structures integrated into said circuit block.

32. A self-contained embedded test design framework as defined in claim 29, said top-level flow repository including:
- a top-level test structure generation flow repository for files associated with generating top-level test structures and assembling said top-level test structures into said circuit block; and
- a top-level verification flow repository for files associated with verification of a test ready circuit block.

33. A self-contained embedded test design framework as defined in claim 29, each said design flow repository further having a process control file for use in performing a test structure design flow within said repository.

34. A self-contained embedded test design framework as defined in claim 33, said process control files including:
- a parent process control file stored in said circuit block repository; and
- child process control files stored in each said flow repository;
- said parent process control file being operable to execute all child process control files in a predetermined sequence.

35. A self-contained embedded test design framework as defined in claim 25, each said flow repository further including a process information file describing procedures for performing a test structure design flow within said repository.

36. A self-contained embedded test design framework as defined in claim 25, each said design flow repository further including a starter flow configuration file for use in configuring a corresponding test structure.

37. A self-contained embedded test design framework as defined in claim 29, said sign-off flow repository containing a concatenated netlist for a complete circuit design, a final set of test vectors for logic testing of said circuit block, test patterns for all the embedded test structures in said circuit, timing analysis scripts for performing analysis of the embedded test structures in the circuit, and test benches for performing simulation of all embedded test structures through a top level of said circuit block.

38. A self-contained embedded test design framework as defined in claim 25, further including a repository for a hand-off database including a circuit block handoff repository for selected files from said flow repositories.

39. A self-contained embedded test design framework as defined in claim 38, said selected files including:
- descriptions of all test steps that are to be performed during manufacturing test;
- descriptions of test-collared versions of said circuit sub-blocks and of connections of collared sub-block test ports;
- descriptions of external scan chains in said test-collared test sub-block;
- descriptions of the periphery logic of said test-collared blocks added to sub-blocks;
- descriptions of all embedded test capabilities of said circuit block.

40. A self-contained embedded test design framework as defined in claim 39, said selected files further including descriptions of any specified physical constraints to enable grouping and port polarity.

41. A self-contained embedded test design framework as defined in claim 39, said selected files further including descriptions contained in a boundary scan description language file generated during generation and integration of said top-level test structures into said circuit block.

* * * * *